(12) United States Patent
Busby

(10) Patent No.: US 6,343,823 B1
(45) Date of Patent: Feb. 5, 2002

(54) VACUUM PICKUP TOOL

(76) Inventor: William G. Busby, 1043 Rawlings Dr., San Jose, CA (US) 95136

( * ) Notice: Subject to any disclaimer, the term of this patent is extended or adjusted under 35 U.S.C. 154(b) by 0 days.

(21) Appl. No.: 09/695,491

(22) Filed: Oct. 23, 2000

(51) Int. Cl.[7] .................................................. B66C 1/02
(52) U.S. Cl. ...................................... 294/64.1; 251/321
(58) Field of Search .............................. 294/64.1, 64.2, 294/64.3; 251/145, 176, 321, 319, 320; 269/21

(56) References Cited

U.S. PATENT DOCUMENTS

| | | | | |
|---|---|---|---|---|
| 2,280,658 A | * | 4/1942 | Miller | 294/64.2 |
| 2,635,623 A | * | 4/1953 | Moffett | 251/321 |
| 3,071,402 A | * | 1/1963 | Lasko et al. | 294/64.1 |
| 3,168,353 A | * | 2/1965 | Horowitz | 251/321 |
| 3,466,079 A | * | 9/1969 | Mammel | 294/64.3 |
| 4,744,594 A | * | 5/1988 | Poli et al. | 294/64.1 |
| 4,767,142 A | * | 8/1988 | Takahashi et al. | 294/64.1 |
| 5,169,192 A | | 12/1992 | Allison et al. | 294/64.1 |
| 5,314,222 A | * | 5/1994 | Oehninger | 294/64.1 |
| 5,511,840 A | * | 4/1996 | Allison et al. | 294/64.1 |
| 5,928,537 A | * | 7/1999 | Fortune | 294/64.1 |
| 6,043,458 A | * | 3/2000 | Fortune | 294/64.1 |

\* cited by examiner

*Primary Examiner*—Eileen D Lillis
*Assistant Examiner*—Paul T. Chin
(74) *Attorney, Agent, or Firm*—Thomas Schneck; Gina McCarthy

(57) ABSTRACT

A vacuum-actuated tool for handling of small articles, such as electronic devices or lenses, having an improved valve mechanism including a valve stem located at an angled position that is less than 90° relative to a longitudinal axis of a body of the tool, a pivotable shell, a grip and angled handle for comfortable control and manipulation of the tool. A spring coil biases the valve stem into an upward position such that a first O-ring fixed to the stem seals a forward passageway to the atmosphere and such that evacuation occurs from said forward passageway to a co-axial rearward passageway permitting retrieval of an item. When the pivotable shell is depressed the spring bias is overcome and the first O-ring moves downward permitting atmospheric air into the forward chamber releasing the retrieved item. A second O-ring blocks fluid communication between the forward passageway and the rearward passageway and vacuum source when the pivotable shell is depressed.

26 Claims, 5 Drawing Sheets

VACUUM PICKUP TOOL

TECHNICAL FIELD

The present invention relates generally to tools for the handling of semiconductor wafers, chips and other articles, such as lenses, and more particularly to an ergonomically shaped vacuum-operated article pickup tool.

BACKGROUND ART

Vacuum operated devices for handling individual semiconductor articles are known in the art. These devices typically include a vacuum-actuated tool and a replaceable wand tip being in vacuum communication with the tool. In operation, the wand tip in association with the vacuum is used to pick up a semiconductor article.

In prior art vacuum activated devices, leakage difficulties occur in valving mechanisms employing a biased valve stem. The valve stem is biased into a position where a groove is aligned with an axial bore of the tool in communication with a vacuum source to cause displacement of an article. Fluid communication occurs between a forward and rearward passageway of the bore, when the groove is aligned with the passageways. A force, such as a user depressing a button or a lever to cause displacement of a valve stem, is used to overcome the bias and displaces the circular groove relative to the bore.

A difficulty associated with this prior art apparatus is eliminating leakage that occurs when the user desires to block off vacuum communication between the forward and rearward passageways. A misalignment of the circular groove and bore results in vacuum pressure leakage and difficulty in releasing an article from the wand tip.

U.S. Pat. No. 5,169,192 to Allison et al. describes an electronic article pickup tool used to overcome problems in the prior art associated with leakage difficulties. The patent describes a tool that ensures immediate release of an article. The vacuum-actuated electronic pickup tool includes an elongated body having a first passageway leading to a tip end of the elongated body. The tip end is brought in contact with an article that is to be picked up or released. The body includes a second passageway in fluid communication with a vacuum source and when in the open position in fluid communication with the first passageway. A third passageway links the first passageway to the atmosphere.

In one embodiment, the valve stem is biased into a normally open position by a spring so that there is fluid communication between the first and second passageways. A positive pressure seal is used to seal the third passageway from the first passageway so that the only the vacuum force is exerted on an article.

When it is desired that the article be released from the vacuum hold, the second passageway is blocked from communication with the first passageway by a sealing members fixed to a valve stem. The valve stem is attached to a button or lever that is used to overcome the bias of the spring when depressed by a user. When in the closed position, the first passageway and third passageway are in fluid communication with each other. Though U.S. Pat. No. 5,169,192 overcomes the problems of the prior art associated with leakage, it fails to provide an apparatus that is ergonomically shaped and that allows for comfortable manipulation of articles over a long period of time.

In U.S. Pat. No. 5,169,192 a button connected to a valve stem is used to overcome the bias of the spring present within the body of the apparatus. The use of the button in combination with the shape of the tool requires awkward positioning of the user's hand and arm thus resulting in a less secure grip on the tool and discomfort to the user. Such loose gripping can result in difficulty in manipulating objects to be displaced, especially when the manipulation is to occur over long periods of time.

It is an object of the present invention to provide a vacuum-actuated tool for handling electronic articles that insures effective and immediate release of the article with comfortable and precise manipulation by a user for even extended periods of time.

SUMMARY OF THE INVENTION

The above objects have been met by a vacuum-actuated article pickup tool of the present invention. The present invention includes an elongated body having a first passageway to a tip end of the elongated body as provided in U.S. Pat. No. 5,169,192. As described in U.S. Pat. No. 5,169,192, the tip end of the elongated body is brought into contact with an article to be displaced. The elongated body includes a second passageway in fluid communication with a vacuum source. The valve stem is biased by a coil spring located beneath the stem, into a position that allows for communication between the first and second passageways. When desired, a sealing member such as an O-ring fixed to the valve stem blocks the fluid communication between the first and second passageway by to release the article. To block communication between the first and second passageways, a force is applied to a button to overcome the spring bias when it is desired that the article be released.

The present invention also includes a third passageway linking the first passageway to the atmosphere, described U.S. Pat. No. 5,169,192. From the first passageway, the passageway to the atmosphere is blocked by a second sealing member (such as an O-ring fixed to the valve stem) when it is desired that fluid communication exist between the first and second passageways. The two O-rings fixed to the valve stem are used to alternatively seal the second and third passageways from the first passageway.

The present invention utilizes two O-rings fixed to a valve stem to alternatively seal a second and third passageway from a first passageway as described in U.S. Pat. No. 5,169,192. However, the valve stem of the present invention is present at an acute angle relative to one of the axial passage ways of the tool body unlike U.S. Pat. No. 5,169,192 where the stem is perpendicularly aligned. A pivotable shell covering an upper portion of the valve stem is depressed rather than a button to overcome the spring force of the spring coil and to block the fluid communication between the first and second passageways. The pivotable shell in combination with an angled valve stem is easier to depress than the button of the prior art. Depressing a button may result in a less secure grip on the tool.

Additionally, the tool of the present invention includes an angled handle upon which the user's arm can rest while operating the tool and a grip around which the user may wrap an index finger to get a secure hold of the tool. The use of the pivotable shell and angled valve stem in addition to the ergonomically desired shape of the apparatus permits the comfortable positioning of the user's hand and arm thus resulting in a secure grip on the tool and comfortable positioning for the user. Such comfortable positioning results in ease in manipulating objects to be displaced, especially when the manipulation is to occur over long periods of time.

DETAILED DESCRIPTION OF THE INVENTION

Figure 1:
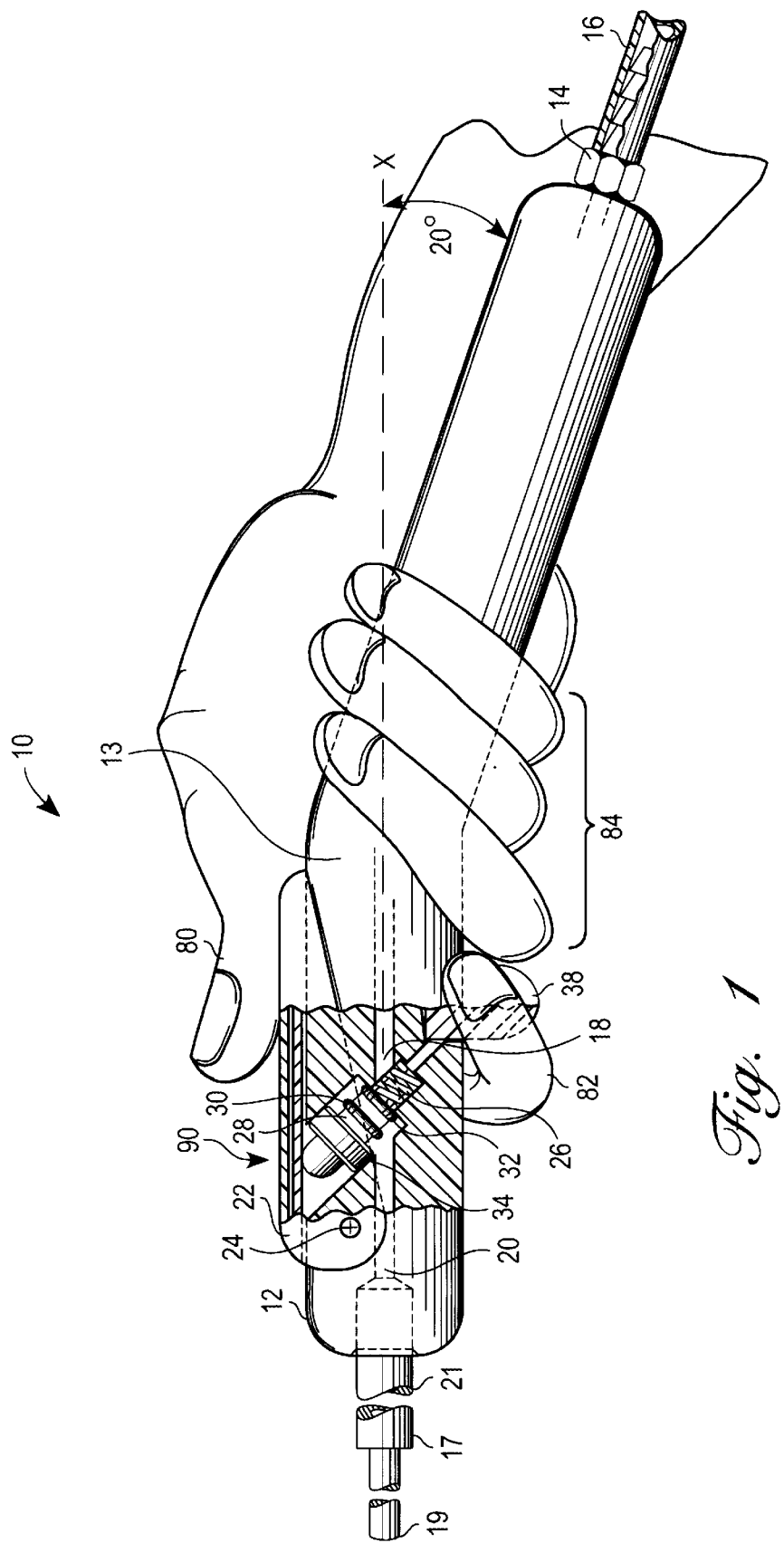
FIG. 1 is a side, partially sectional view of a vacuum-actuated tool in accord with the present invention.

With reference to FIG. 1, a vacuum-actuated pickup tool 10 is shown having an elongated body 12 having an axis with opposed axial ends. At a back end of the body 12 is a fitting 14 having external threads which are received within an internally threaded bore of the body. The fitting 14 is adapted to be connected to a hose 16 leading to a source of vacuum (not shown). The fitting includes a passageway in fluid communication with a rearward passageway 18 in the body.

In the closed position shown in FIG. 1, the rearward passageway 18 is blocked from being in fluid communication with a forward passageway 20 by user depression of a pivotable shell 22 of a valve. The valve is disposed within a bore of the device. To depress the shell 22, the user presses his thumb 80 against the shell 22 as an index finger 82 wraps around a grip 38 and fingers 84 wrap around a handle 13 for strength and support. The use of the shell allows for a user to easily manipulate the valve mechanism located within the body 12. The shell pivots about a hinge pin 24 inserted within the body 12. A coil spring 26 biases the valve into an open position, shown in FIG. 2A.

At a front end of the elongated body 12 is fastening hardware designed to allow connection of a number of different tips that can be used in different applications. The hardware includes a lock ferrule 21 on a hollow tube having a first end 17 connected to the body 12 and a second end 19 adapted for attachment to a pickup tip (not shown).

At the back end of the elongated body 12 is the angled handle 13. The handle 13 is angled at for example approximately 20° relative to a longitudinal axis X of the body of the tool. The handle 13, in combination with the grip 38 and the pivotable shell 22 allow for a user to easily grip and comfortably manipulate the tool 10.

Valve mechanism 90 having the pivotable shell 22 includes a valve stem 28 that fits within a stationary cap 34. The cap 34 is fixed to an inner surface of the body 12. A pair of elastomeric seals such as a pair of O-rings 30 and 32, are fixed to the valve stem 28 so that one O-ring is above the other.

Figure 2A:
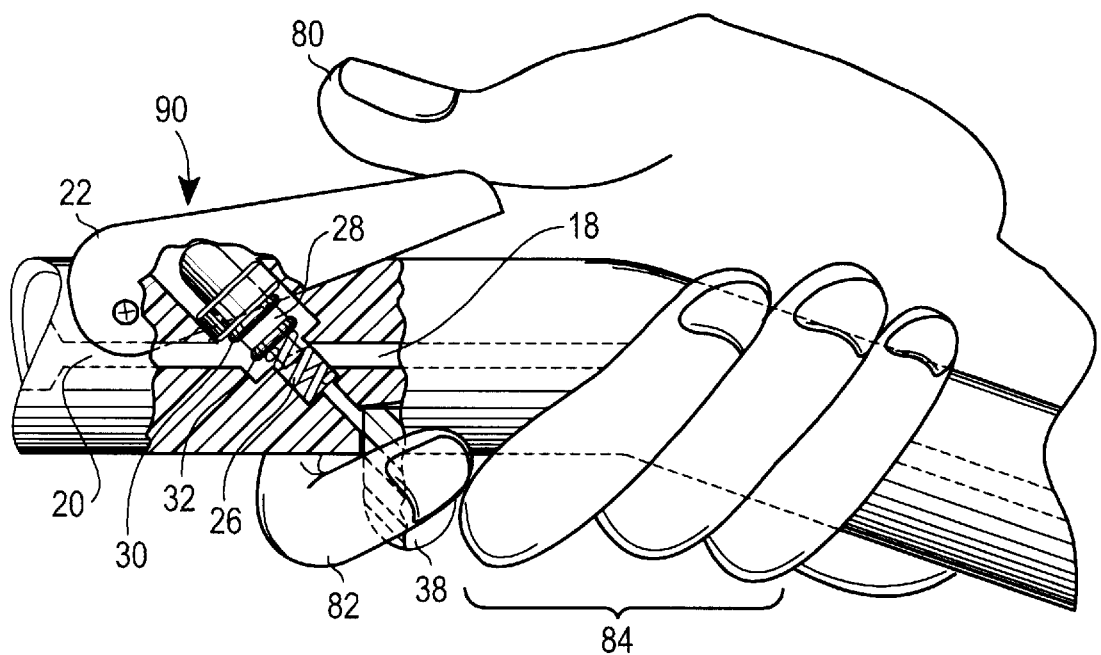
FIG. 2A is a side, partially sectional view of the vacuum-actuated tool of FIG. 1 in an open position.

Referring to FIG. 2A there is seen the vacuum-actuated pickup tool 10 in an open position. In the open position, the user is not depressing the pivotable shell 22 of the valving mechanism 90. Instead, the coil spring 26 biases the valve stem 28 into a raised position. In the biased position the O-rings 30 and 32 move upward. Upward movement of the lower O-ring 32 permits fluid communication between axial rearward passageway 18 and axial forward passageway 20. The passageways 18 and 20 may be co-axially aligned. As evacuation from the forward passageway 20 around spring coil 26 and valve stem 28 to rearward passageway 18 occurs, a pickup of a semiconductor chip or the like is initiated. O-ring 30 is moved up against stationary cap 34 by the coil spring 26. The upward movement of O-ring 30 permits the O-ring to seal a passageway 66 to the atmosphere (seen in FIG. 6). This positive pressure seal insures that leakage between the passageway 66 to either passageway 18 or 20 does not occur. The path to the ambient atmosphere is from the forward passageway 20 through an upper portion of valve chamber 50 (seen in FIGS. 3 and 4) and the passageway 66 comprising a space between the cap 34 and the valve stem 28 (seen in FIG. 6).

Figure 2B:
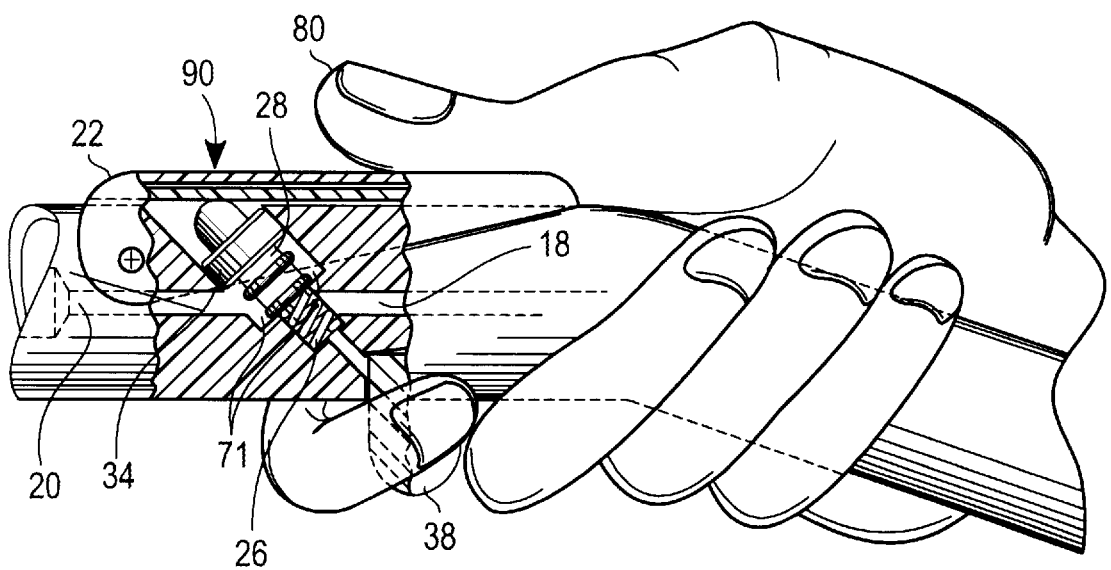
FIG. 2B is a side, partially sectional view of the vacuum-actuated tool of FIG. 1 in a closed position.

With reference to FIG. 2B there is seen the vacuum-actuated pickup tool in the closed position. In the closed position, the user is depressing the pivotable shell 22 with his thumb 80. Depressing overcomes the bias of coil spring 26. The valve stem 28 and the O-rings 30 and 32 fixed to the stem are lowered as the pivotable shell is depressed. As O-ring 30 is lowered away from the stationary cap 34 the passageway to the atmosphere 66 is provided with an opening to the forward passageway 20 and fluid communication between the two passageways 20 and 66 results. As O-ring 32 is lowered away from cap 34 it blocks the fluid communication between the forward passageway 20 and the rearward passageway 18. This positive pressure seal insures that leakage between the forward 20 and rearward 18 passageways does not occur. In the closed position, O-ring 32 rests upon a pair of seating members 71 confining coil spring 26 to a lower portion of valve chamber 50 (seen in FIGS. 3 and 4).

Figure 3:
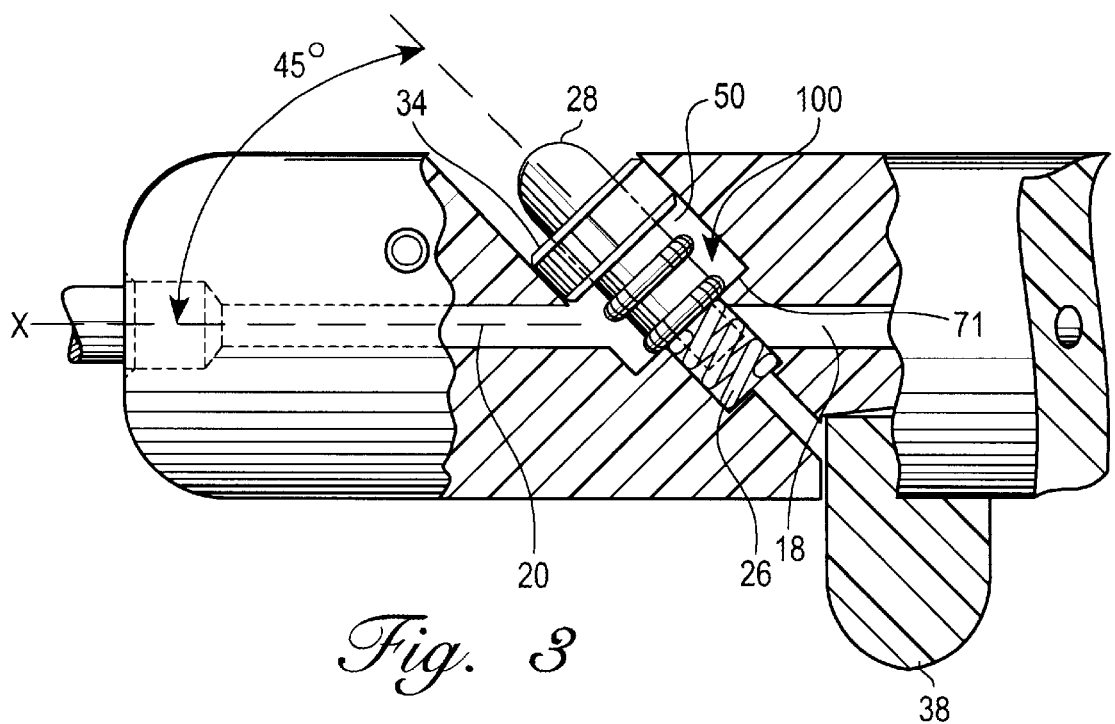
FIG. 3 is a side partially sectional view of a part of the vacuum-actuated tool of FIG. 1 without a pivotable shell, in a closed position.
Figure 4:
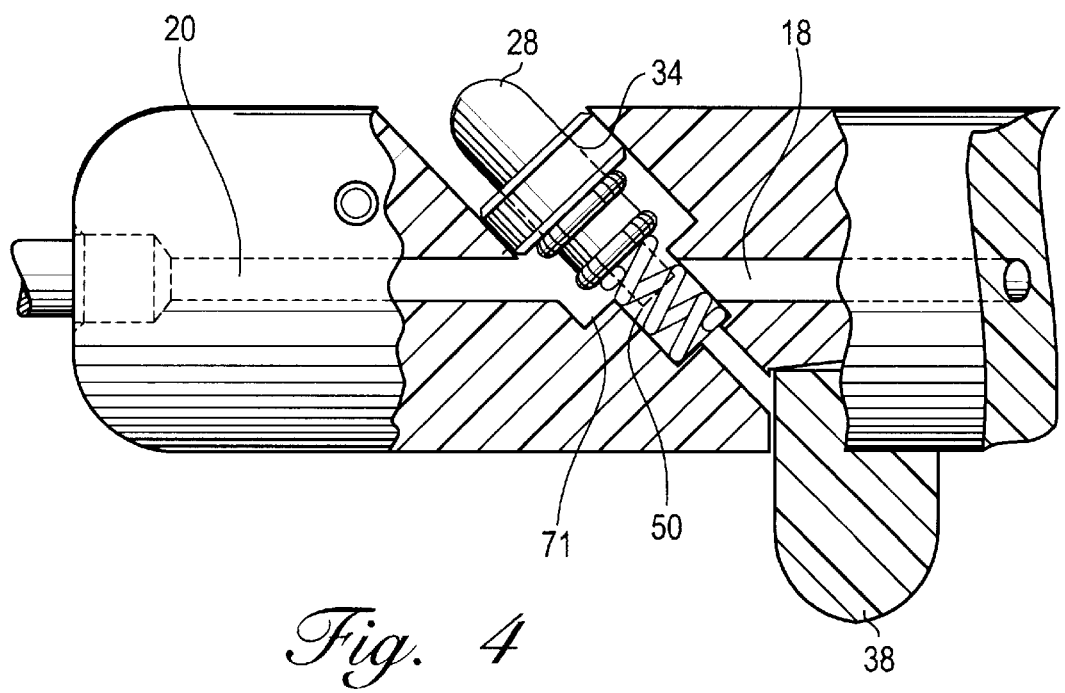
FIG. 4 is a side partially sectional view of a part of the vacuum-actuated tool of FIG. 1 without a pivaotable shell, in an open position.

In FIGS. 3 and 4 it is seen that the slidable valve stem 28 is obtusely angled for example at approximately 45° relative to the longitudinal axis X of the body 12.

Each flat seating member 71 is shaped from within the bore of the body 12 of the vacuum actuated tool 12 and is perpendicular to the side walls of chamber 50. Seating members 71 form shelf 100 which is for example annular in shape. When O-ring 32 rests upon seating members 71, the rearward passageway 18 is blocked from communicating with forward passageway 20 and a constricted region of the bore is formed.

Figure 5:
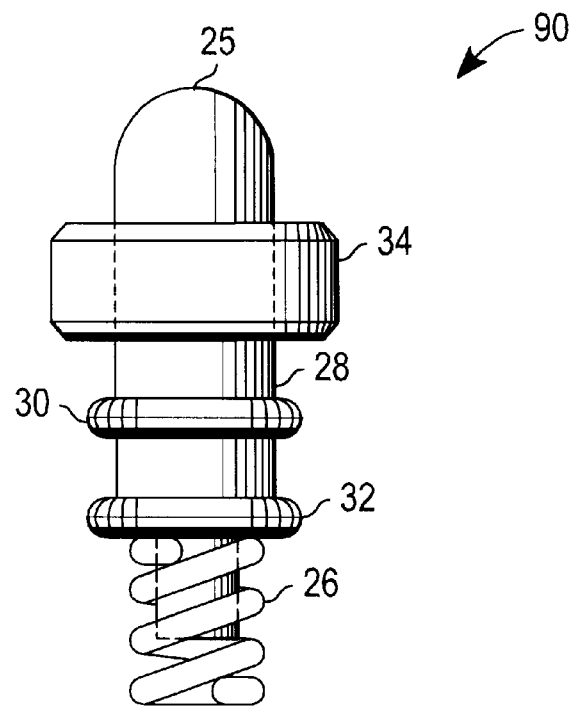
FIG. 5 is a view of the valve mechanism of FIG. 1 without a pivotable shell.
Figure 6:
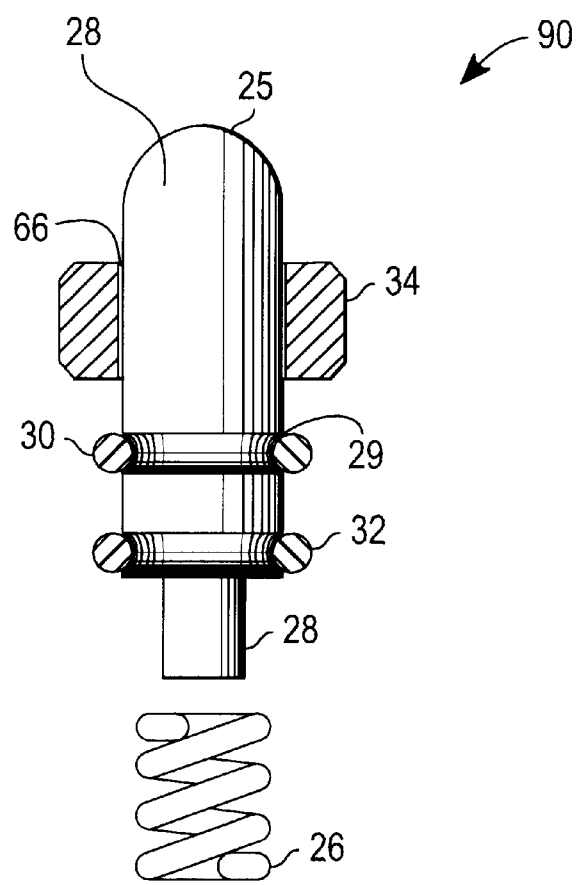
FIG. 6 is a cutaway view of the valve of FIG. 5.

Pictured in FIGS. 5 and 6 is the valving mechanism 90 without the pivotable shell 22. The valve stem 28 of valving mechanism 90 is a unitary member having a reduced diameter portion 29 that is inserted within coil 26 and a rounded tip 25 that fits within pivotable shell 22. The valve stem 28 also has a reduced diameter portion at areas where the O-rings 30 and 32 are fixed. A gap between the inside diameter of the cap 34 and the surface of the valve stem 28 defines the passageway 66 to the atmosphere. When the valve is in the closed position, the passageway 66 connects forward passageway 20 to the atmosphere.

Figure 7:
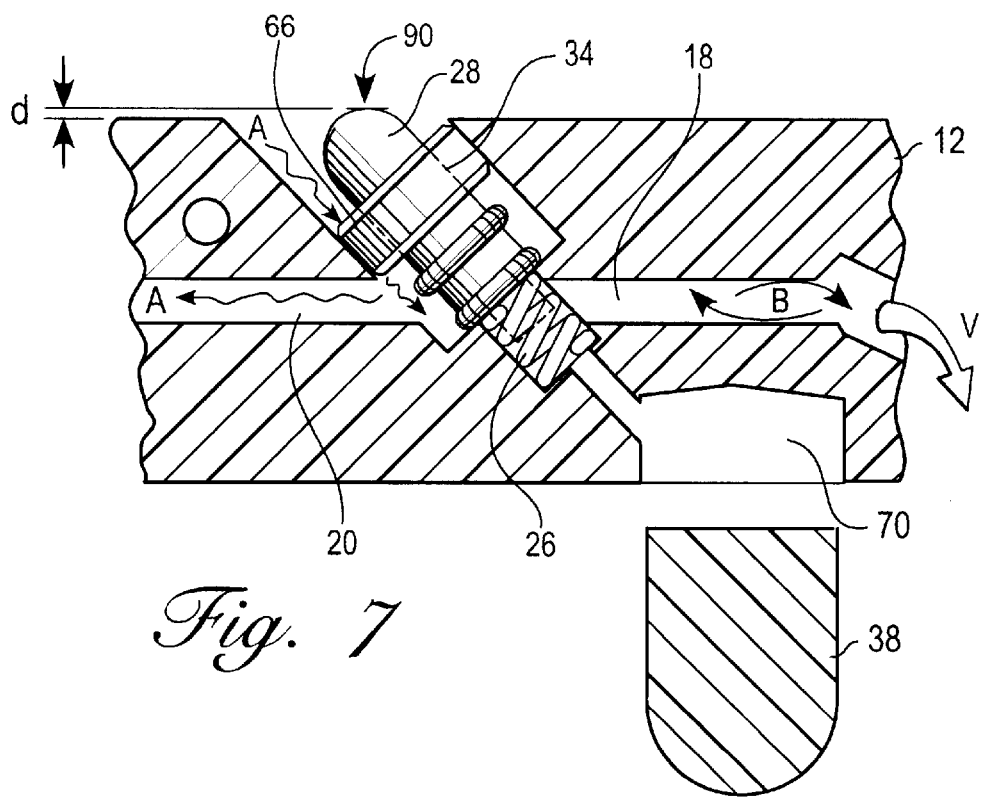
FIG. 7 is a sectional view of a part of the vacuum-actuated tool of FIG. 1 in a closed position.
Figure 8:
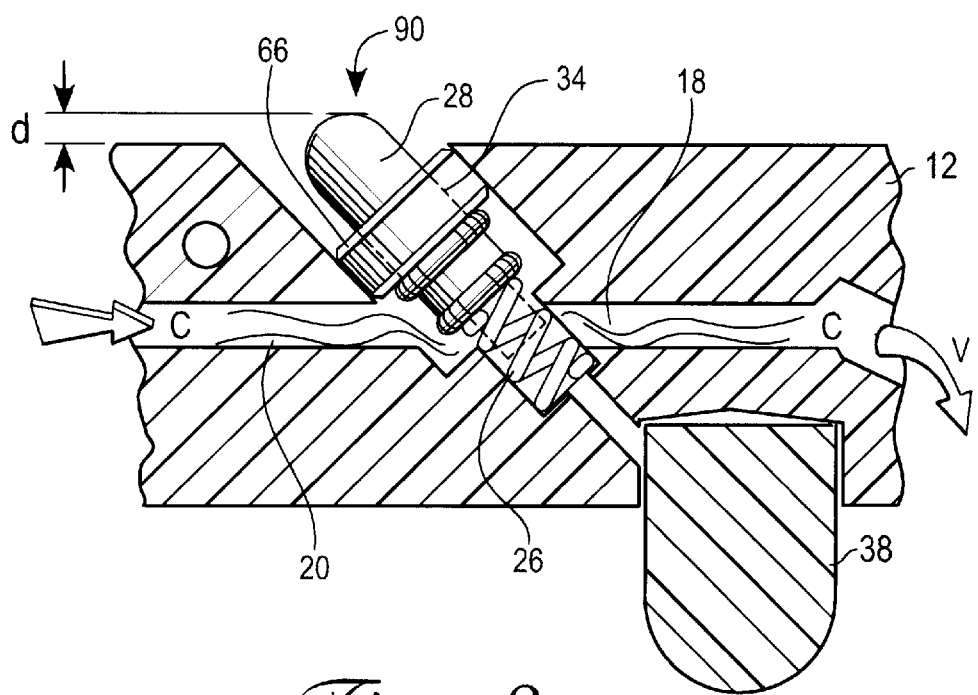
FIG. 8 is a sectional view of a part of the vacuum-actuated tool of FIG. 1 in an open position.

FIGS. 7 and 8 illustrate air passageways in communication with the valve mechanism 90 (without pivotable shell). In FIG. 7, the valve stem 28 is in the closed position blocking off fluid communication between the forward passageway 20 and the rearward passageway 18. In other words, the valve stem 28 has been depressed a distance through use of shell 22 resulting in a distance d between an upper surface of the body 12 and an axis extending from a point on the highest surface of the stem 28 parallel to the upper surface of the body 12. However, as the O-rings of the valve stem 28 are lowered away from the cap 34, passageway 66 (FIG. 6) is open to fluid communication with passageway 20. Therefore, atmospheric air enters the forward passageway as indicated by the path labeled A and provides a quick and reliable return of the forward passageway 20 to atmospheric pressure. This allows for the release of the article that was retrieved. Evacuation force from the vacuum source, indicated by the label V, present in the rearward passageway 18 is blocked from entering the forward passageway 20 as indicated by the path labeled B.

In FIG. 8, the valve stem 28 is in the open position and fluid communication exists between forward passageway 20 and rearward passageway 18 as indicated by the path C. In other words, the stem 28 has not been depressed and a distance D, greater than d, exists between the upper surface of the body 12 and an axis extending from a point on the highest surface of the stem 28. Evacuation force, V is able to exert a force on the forward passageway 20 so that an article may be retrieved from tip 19 (FIG. 1). The spring 26 biases the valve stem such that O-ring 30 is pressed up against cap 34 sealing passageway 66 from forward passageway 20.

Grip 38 is seen to have a holding 70 into which grip 38 is inserted. The holding may provide for a detachable or non-detachable insertion.

The tool 10, including pivotable shell 22, angled valve stem 28, angled handle 13 and grip 38 allow for a user to easily, securely and comfortably grip and actuate the tool 10 for extended periods of time.

What is claimed is:

1. A hand-held tool for handling of articles comprising:
    an elongated body having a horizontal axis with opposed axial ends defining a tip portion and a back portion, said tip portion having a first horizontal axial passageway and said back portion having a second horizontal axial passageway, a chamber in fluid communication with said first and second passageways,
    valve means disposed within said chamber to seal said first passageway from said second passageway, said valve means including a slidable stem member mounted for displacement at an obtuse angle relative to one of the axial passageways, a compliant seal and a pair of seating members, and
    means for biasing said slidable member into a first position wherein said compliant seal is away from said seating members such that said first and second passageways are in fluid communication with each other wherein a force overcoming said bias is applied to said valve means to rest said seal against said seating members.

2. The tool of claim 1 wherein said valve means further comprises a shell pivotably mounted to an upper exterior surface of said body wherein an upper portion of said slidable stem fits within said shell and said overcoming force is applied to said shell and said stem.

3. The tool of claim 2 wherein said back portion of said body is angled.

4. The tool of claim 2 wherein said back portion of said body is angled about 20° relative to the longitudinal axis of said body.

5. The tool of claim 1 wherein the slidable member is angled about 45° relative to the longitudinal axis of said body.

6. The tool of claim 5 further comprising a grip extending from a lower surface of said body.

7. The tool of claim 1 wherein said compliant seal is an O-ring.

8. The tool of claim 1 wherein said biasing means is a spring.

9. The tool of claim 1 wherein said body further comprises a third passageway to the atmosphere wherein an upper portion of said chamber is in fluid communication with said first and said third passageways.

10. The tool of claim 9 wherein said valve means further comprises an upper compliant seal and a cap means above said upper seal within which said valve stem is inserted.

11. The tool of claim 10 wherein said first position includes a position wherein said upper compliant seal rest against said cap means.

12. A hand-held tool for handling of articles comprising:
    an elongated body having a tip portion and having a back portion, said tip portion associated with a first horizontal axial passageway and said back portion associated with a second horizontal axial passageway, said body having a third a passageway open to the atmosphere and an upper portion of a chamber in fluid communication with said first and third passageways and a lower portion of said chamber in fluid communication with said first and second passageways, and
    valve means disposed within said chamber to alternatively seal said first passageway from said second passageway and said third passageway, said valve means including a slidable stem member mounted for displacement at an obtuse angle relative to one of the axial passageways, an upper compliant seal and a lower compliant seal fixed to said member, a pair of seating members and a cap means surrounding a portion of said member,
    means for biasing said slidable member into a first position wherein said upper compliant seal rests against said cap means such that said first and second passageways are in fluid communication with each other and a force for overcoming said bias resulting in a second position wherein said lower compliant seal rests against said seating members such that said first and third passageways are in fluid communication with each other.

13. The tool of claim 12 wherein said valve means comprises a shell pivotably mounted to an upper exterior of said body wherein an upper portion of said slidable stem fits within said shell and said overcoming force is applied to said shell and said stem.

14. The tool of claim 12 wherein said back portion of said body is angled.

15. The tool of claim 14 wherein said back portion of said body is angled about 20° relative to the longitudinal axis of said body.

16. The tool of claim 12 wherein said slidable stem member is angled about 45° relative to the longitudinal axis of said body.

17. The tool of claim 12 further comprising a grip extending from a lower surface of said body.

18. The tool of claim 12 wherein said compliant seal is an O-ring.

19. The tool of claim 12 wherein said biasing means is a spring.

20. A hand held tool for article pickup comprising:
    an elongated body with an axial passageway for fluid flow having a spring biased slidable stem disposed in a bore within the body at an obtuse angle relative to the passageway, the stem moveable between a first position extending from the elongated body and a second position more internal to the elongated body than the first position, the stem blocking the axial passageway in the second position and opening the axial passageway to fluid flow in the first position, a finger actuated moveable force member associated with the elongated body capable of urging the stem from the one position to the other.

21. The tool of claim 20 wherein the stem carries first and second spaced apart O-rings, each O-ring acting as a stop member defining the first and second positions of the stem.

22. The tool of claim 21 further defined by an annular member disposed in said bore cooperating with one of the first and second O-rings as a stop member.

23. The tool of claim 22 further defined by said bore having an annular shelf forming a constricted region of the bore, cooperating with the other of the first and second O-rings as a stop member.

24. A hand-held tool for handling of articles comprising:

an elongated unitary body having, a longitudinal first axis with opposed axial ends, an axial front portion, having a first axial passageway, said axial passageway having an open and a blocked position, a rear portion having a second axis and a second passageway within said rear portion, said second passageway in fluid communication with said first passageway, a chamber in said front portion in fluid communication with said first passageway, valve means disposed within said chamber, said valve means including a slidable stem member mounted for displacement at obtuse angle relative to the longitudinal first passageway, a compliant seal and a pair of seating members, and means for biasing said slidable member into a first position wherein said compliant seal is away from said seating members such that said paasageway is in an open position wherein a force overcoming said bias is applied to said valve means to rest said seal against said seating members such that said passageway is in a blocked position.

25. The tool of claim 24 wherein said back portion of said body is angled.

26. The tool of claim 25 wherein said valve means comprises a shell pivotably mounted to an upper exterior of said body wherein an upper portion of said slidable stem fits within said shell and said overcoming force is applied to said shell and said stem.

* * * * *